(12) United States Patent
Yu et al.

(10) Patent No.: US 9,583,564 B2
(45) Date of Patent: Feb. 28, 2017

(54) ISOLATION STRUCTURE

(71) Applicant: TAIWAN SEMICONDUCTOR MANUFACTURING COMPANY, LTD., Hsinchu (TW)

(72) Inventors: Shu-Jenn Yu, Hsinchu (TW); Meng-Wei Hsieh, Hsinchu (TW); Shih-Hsien Yang, Zhubei (TW); Hua-Chou Tseng, Hsinchu (TW); Chih-Ping Chao, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/177,451

(22) Filed: Feb. 11, 2014

(65) Prior Publication Data

US 2014/0264618 A1    Sep. 18, 2014

Related U.S. Application Data

(60) Provisional application No. 61/799,743, filed on Mar. 15, 2013.

(51) Int. Cl.
| | |
|---|---|
| *H01L 29/78* | (2006.01) |
| *H01L 21/761* | (2006.01) |
| *H01L 29/06* | (2006.01) |
| *H01L 21/762* | (2006.01) |
| *H01L 29/10* | (2006.01) |
| *H01L 29/66* | (2006.01) |

(52) U.S. Cl.
CPC ........ *H01L 29/0646* (2013.01); *H01L 21/761* (2013.01); *H01L 21/7624* (2013.01); *H01L 29/0619* (2013.01); *H01L 29/1087* (2013.01); *H01L 29/66659* (2013.01); *H01L 29/7835* (2013.01); *H01L 29/665* (2013.01)

(58) Field of Classification Search
CPC ............. H01L 29/66477; H01L 29/78; H01L 29/0646; H01L 21/761; H01L 21/7624; H01L 29/1087; H01L 29/66659; H01L 29/7835; H01L 29/0619
See application file for complete search history.

(56) References Cited

U.S. PATENT DOCUMENTS

| | | | | |
|---|---|---|---|---|
| 6,765,771 | B2 * | 7/2004 | Ker et al. ................. | 361/56 |
| 8,283,722 | B2 * | 10/2012 | Ito ............................ | 257/339 |
| 8,525,258 | B2 * | 9/2013 | Huang et al. ............. | 257/336 |
| 2002/0149067 | A1 * | 10/2002 | Mitros ............... | H01L 21/761 257/409 |
| 2005/0073007 | A1 * | 4/2005 | Chen ................. | H01L 29/1083 257/355 |
| 2006/0006462 | A1 * | 1/2006 | Chang et al. ............. | 257/341 |
| 2006/0124999 | A1 * | 6/2006 | Pendharkar ........ | H01L 29/0878 257/335 |

(Continued)

*Primary Examiner* — Jarrett Stark
*Assistant Examiner* — Bitew Dinke
(74) *Attorney, Agent, or Firm* — Hauptman Ham, LLP

(57) ABSTRACT

A structure comprises a p-type substrate, a deep n-type well and a deep p-type well. The deep n-type well is adjacent to the p-type substrate and has a first conductive path to a first terminal. The deep p-type well is in the deep n-type well, is separated from the p-type substrate by the deep n-type well, and has a second conductive path to a second terminal. A first n-type well is over the deep p-type well. A first p-type well is over the deep p-type well.

21 Claims, 9 Drawing Sheets

(56) References Cited

U.S. PATENT DOCUMENTS

| | | | |
|---|---|---|---|
| 2006/0261382 A1* | 11/2006 | Khemka et al. | 257/262 |
| 2006/0261408 A1* | 11/2006 | Khemka | H01L 29/8611 |
| | | | 257/335 |
| 2007/0131992 A1* | 6/2007 | Dosluoglu | H01L 27/14609 |
| | | | 257/292 |
| 2008/0128756 A1* | 6/2008 | Satoh | 257/203 |
| 2008/0157197 A1* | 7/2008 | Hsieh et al. | 257/339 |
| 2009/0042331 A1* | 2/2009 | Dosluoglu et al. | 438/59 |
| 2009/0256200 A1* | 10/2009 | Yao et al. | 257/345 |
| 2010/0096697 A1* | 4/2010 | Su et al. | 257/343 |
| 2010/0295125 A1* | 11/2010 | Ito | 257/339 |
| 2011/0309443 A1* | 12/2011 | Huang et al. | 257/343 |
| 2012/0086099 A1* | 4/2012 | Yeh et al. | 257/475 |
| 2012/0168862 A1* | 7/2012 | Lee et al. | 257/336 |
| 2012/0168906 A1* | 7/2012 | Kuo et al. | 257/557 |
| 2013/0093016 A1* | 4/2013 | Ko et al. | 257/343 |
| 2013/0168766 A1* | 7/2013 | Lee et al. | 257/335 |
| 2013/0200445 A1* | 8/2013 | Lee | 257/288 |
| 2013/0320498 A1* | 12/2013 | Salcedo | H01L 29/747 |
| | | | 257/565 |

\* cited by examiner

US 9,583,564 B2

ISOLATION STRUCTURE

CROSS-REFERENCES TO RELATED APPLICATIONS

The present application claims the priority of U.S. Provisional Application No. 61/799,743, filed Mar. 15, 2013, and relates to U.S. patent application Ser. Nos. 11/784,721 and 12/910,000, which are commonly owned and assigned, and are hereby incorporated by reference for all purposes.

BACKGROUND

One trend in today's commercial world is the relentless pursuit of a competitive advantage for one's products and services. This trend is particularly acute in the semiconductor device arena. Competitive advantage is sought in a number of different forms, including providing new capabilities and providing multiple capabilities on a single device that previously required multiple devices.

High voltage metal oxide semiconductor field effect transistors (MOSFETs) have proven useful in a variety of real world applications. However, integrated circuits (ICs) that include high voltage MOSFETs have proven difficult to combine with lower power devices, such as those used in radio-frequency (RF) and analog applications, on the same integrated circuit, because electrical noise associated with switching MOSFET transistors at higher power can travel through a semiconductor substrate of an integrated circuit to interfere with the normal operation of lower power devices.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are examples and are not intended to be limiting.

In various embodiments, an isolation structure for a high voltage MOSFET is described. In some embodiments, high voltage MOSFETs, lower voltage devices, and the isolation structure described herein enable competitive advantage. For example, the isolation structure allows multiple capabilities to exist on the same substrate, thereby enabling new combined capabilities and a competitive advantage. In some embodiments, the isolation structure includes both a deep n-type doped well ("DNW") layer and a deep p-type doped well ("DPW") layer that are configured to mitigate or prevent electrical noise from the MOSFET from interfering with operation of other devices resident on the same substrate as the MOSFET device. Examples of other devices include RF and analog devices.

Figure 1:
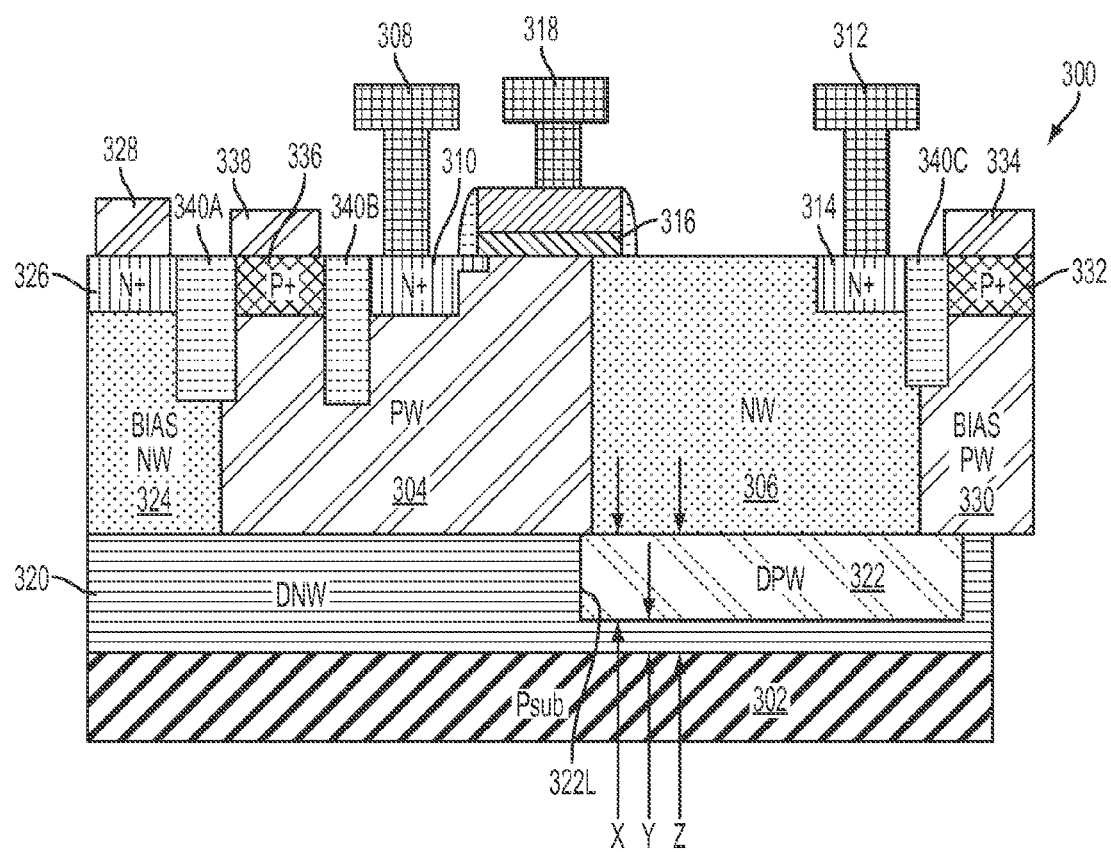
FIG. 1 is a cross-sectional side view of an isolation structure for a MOSFET, in accordance with some embodiments.

FIG. 1 is a cross-sectional side view of a MOSFET 300 having an isolation structure, in accordance with some embodiments. MOSFET 300 is a high voltage MOSFET formed on a p-type doped substrate (Psub) 302. MOSFET 300 includes a p-type doped well (PW) 304 and an n-type doped well (NW) 306. A source terminal 308 is capable of being electrically coupled with n-type doped source region 310. A drain terminal 312 is capable of being electrically coupled with n-type doped drain region 314. Between the source region 310 and the drain region 314 is a gate oxide 316 and conductive materials capable of being electrically coupled to a gate terminal 318. A deep n-type well ("DNW") 320 and a deep p-type well ("DPW") 322 function to electrically isolate the Psub 302. In some embodiments, the DPW 322 is formed by ion implantation. In some embodiments, the DPW 322 can be extended further to the left below the P-well 304 to enable a more conductive connection with the P-well 304. For example, a sidewall 322L of the DPW 322 is extended further to the left below the P-well 304. The DNW 320 is formed over the Psub 302 and the DPW 322 is formed in the DNW 320.

The DNW 320 is capable of being electrically coupled through a bias n-type doped well ("Bias NW") 324, which is formed on the DNW 320 to a bias n-type doped region 326. The term "Bias" is intended to designate the function of the corresponding structure, in order to differentiate similar structures with different functions, and is not intended to limit the method of forming the identified bias structure. The bias n-type doped region 326 is capable of being electrically coupled with a DNW bias terminal 328. A voltage applied to the DNW bias terminal 328 passes through a conductive path to the DNW 320 in order to provide a voltage bias to the DNW 320. For example, a bias voltage applied to the DNW bias terminal 328 passes through the bias n-type doped region 326 and the Bias NW 324 to the DNW 320.

Analogous to the DNW 320, the DPW 322 is capable of being electrically coupled through a bias p-type doped well ("Bias PW") 330, which is formed on the DPW 322 to a bias p-type doped region 332. The bias p-type doped region 332 is capable of being electrically coupled with a DPW bias terminal 334. A voltage applied to the DPW bias terminal 334 passes through a conductive path to the DPW 322 in order to provide a voltage bias to the DPW 322. For example, a bias voltage applied to the DPW bias terminal 334 passes through the bias p-type doped region 332 and the Bias PW 330 to the DPW 322.

A portion of the PW 304 beneath the gate oxide 316 is used as a channel region. The PW 304 is capable of being electrically coupled to a conductive bias voltage terminal 338. Shallow trench isolation (STI) structures 340A, 340B, and 340C are formed between the n-type doped regions 310, 314, 326, and corresponding p-type doped regions 332, 336. For example, the STI structure 340A is formed between the n-type doped region 326 and the p-type doped region 336. The STI structure 340B is formed between the p-type doped region 336 and the n-type doped region 310. The STI structure 340C is formed adjacent the n-type doped region 314. The STI structures 340A, 340B, and 340C serve to electrically isolate voltages applied to the terminals 308, 312, 318, 328, 334, 338 to power, control and bias the MOSFET 300. In some embodiments, the bias voltage terminal 338 is used to bias DPW 322.

The isolation structure associated with MOSFET 300 is superior to the structures in other approaches because the DNW 320 in combination with the DPW 322 greatly reduce electrical noise leaking into the Psub 302 that would otherwise interfere with lower voltage devices resident on the Psub 302. For example, in other approaches that do not have the DNW 320 and/or the DPW 322, the corresponding structure is susceptible to electrical noise from the high voltage MOSFET when the output of the MOSFET is transitioning.

Three dimensions, X, Y and Z are shown in FIG. 1. Dimension X represents a thickness of the DPW 322. Dimension Y represents a thickness of the DNW 320 with reference to DPW 322. Dimension Z represents a combined thickness of dimension X and dimension Y. In some embodiments, dimension X is between 100 nanometers (nm) and 600 nm. Dimension Y is between 100 nm and 900 nm. Dimension Z is between 200 nm and 1,500 nm. In some embodiments, the selected thickness of dimension X depends on the voltages applied, i.e., dimension X is selected to thick enough to prevent voltage punch-through.

In some embodiments, the n-type doped regions 326, 310, and 314 are n+ type as illustratively shown in FIG. 1. In some embodiments, the p-type doped regions 336 and 332 are p+ type as illustratively shown in FIG. 1.

Figure 2:
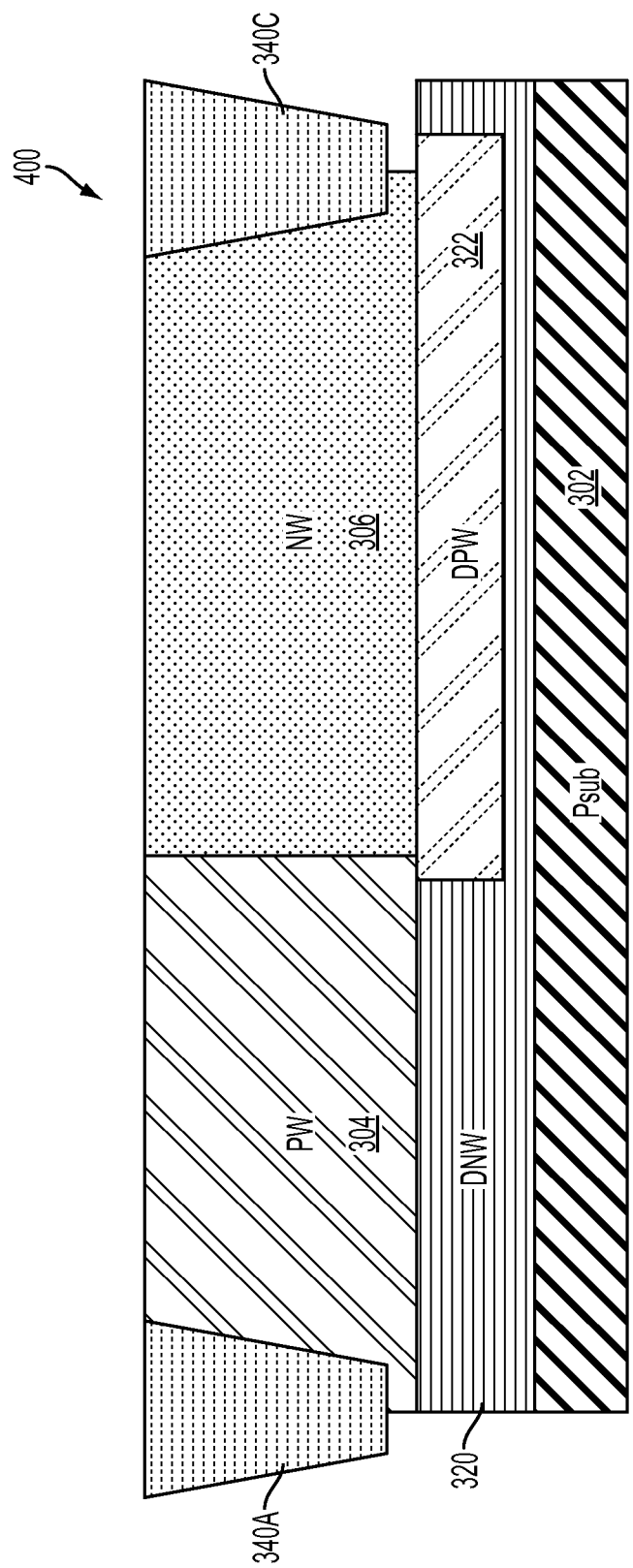
FIG. 2 to FIG. 8 are cross-sectional side views during a process to form the isolation structure for the MOSFET in FIG. 1, in accordance with some embodiments.

FIG. 2 is a cross-sectional side view 400 during a process to form an isolation structure for the MOSFET 300, in accordance with some embodiments. P-type dopants are introduced into a substrate to form Psub 302. The DNW 320 is formed in the Psub 302 in some embodiments. In other embodiments, the DNW 320 is formed over the Psub 302. In some embodiments, the DPW 322 is formed in the DNW 320. In some embodiments, the DPW 322 is formed by ion implantation, such as with Boron ions implanted at 300 kiloelectron volts (Key). In some other embodiments, boron difloride (BF2) ions are implanted at 100 Key to form the DPW 322. In other embodiments, the DPW 322 is formed by selective diffusion. In some embodiments, the ion concentration is between $10^{17}$ and $10^{19}$ ions per cubic centimeter. Subsequently, PW 304 and shallow trench isolation (STI) structure 340A are formed on the left side, and NW 306 and shallow trench isolation (STI) structure 340C are formed on the right side of the isolation structure of the MOSFET 300.

Figure 3:
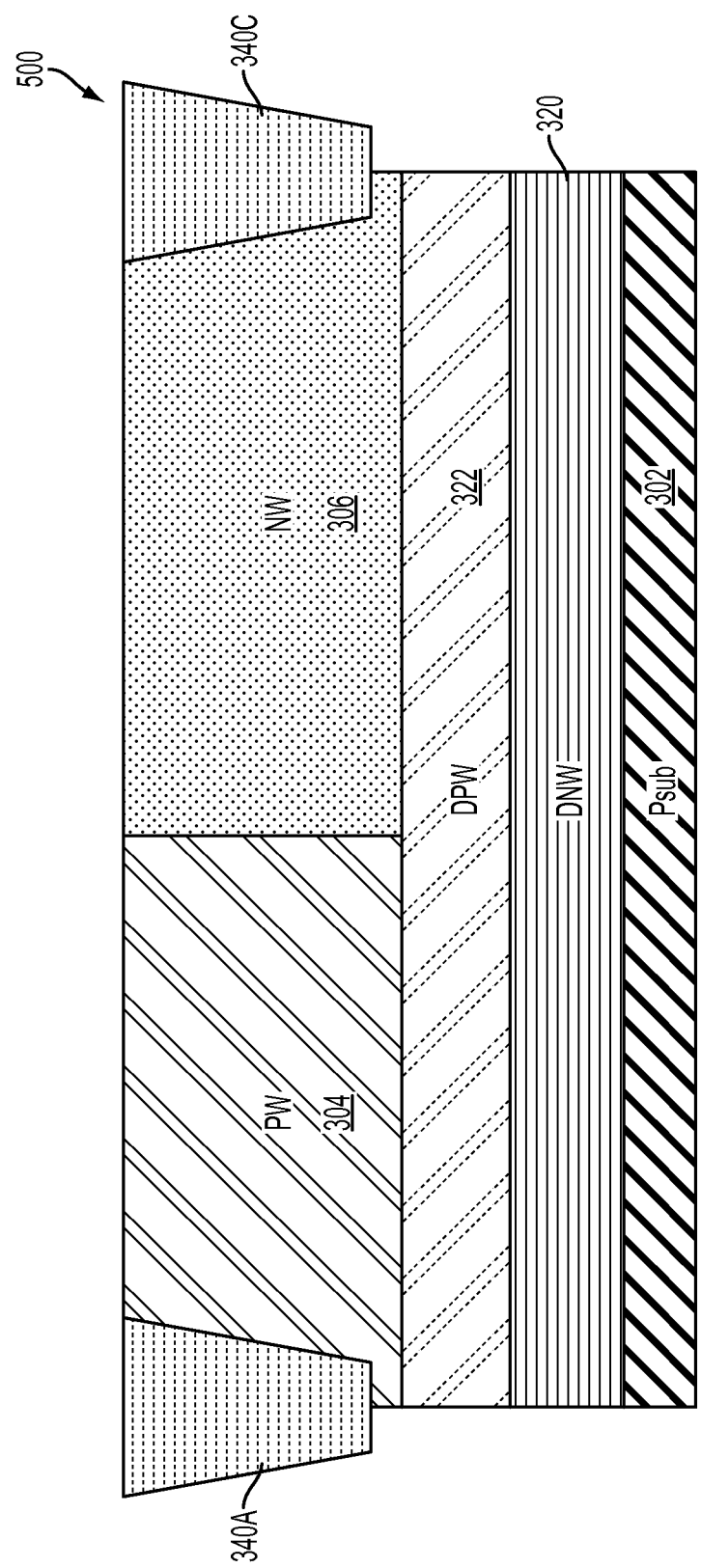

FIG. 3 is a cross-sectional side view 500 during a process to form an isolation structure for the MOSFET 300, in accordance with some alternative embodiments. In these alternative embodiments, p-type dopants are introduced into the substrate to form Psub 302. The DNW 320 is formed in the Psub 302 in some alternative embodiments. In other alternative embodiments, the DNW 320 is formed over the Psub 302. In some alternative embodiments, the DPW 322 is formed over the DNW 320. In some embodiments, the DPW 322 is formed in the DNW 320 by ion implantation, such as with Boron ions implanted at 300 kiloelectron volts (Key). In some other embodiments, boron difloride (BF2) ions are implanted at 100 Key to form the DPW 322. In other embodiments, the DPW 322 is formed by chemical vapor deposition (CVD). In some embodiments, the ion concentration is between $10^{17}$ and $10^{19}$ ions per cubic centimeter. Subsequently, the PW 304 and shallow trench isolation (STI) structure 340A are formed on the left side, and NW 306 and shallow trench isolation (STI) structure 340C are formed on the right side of the isolation structure of the MOSFET 300.

FIG. 3 depicts an alternative structure of the structure of FIG. 2. The following description is based on the structure of FIG. 2, and is also applicable to the structure of FIG. 3.

Figure 4:
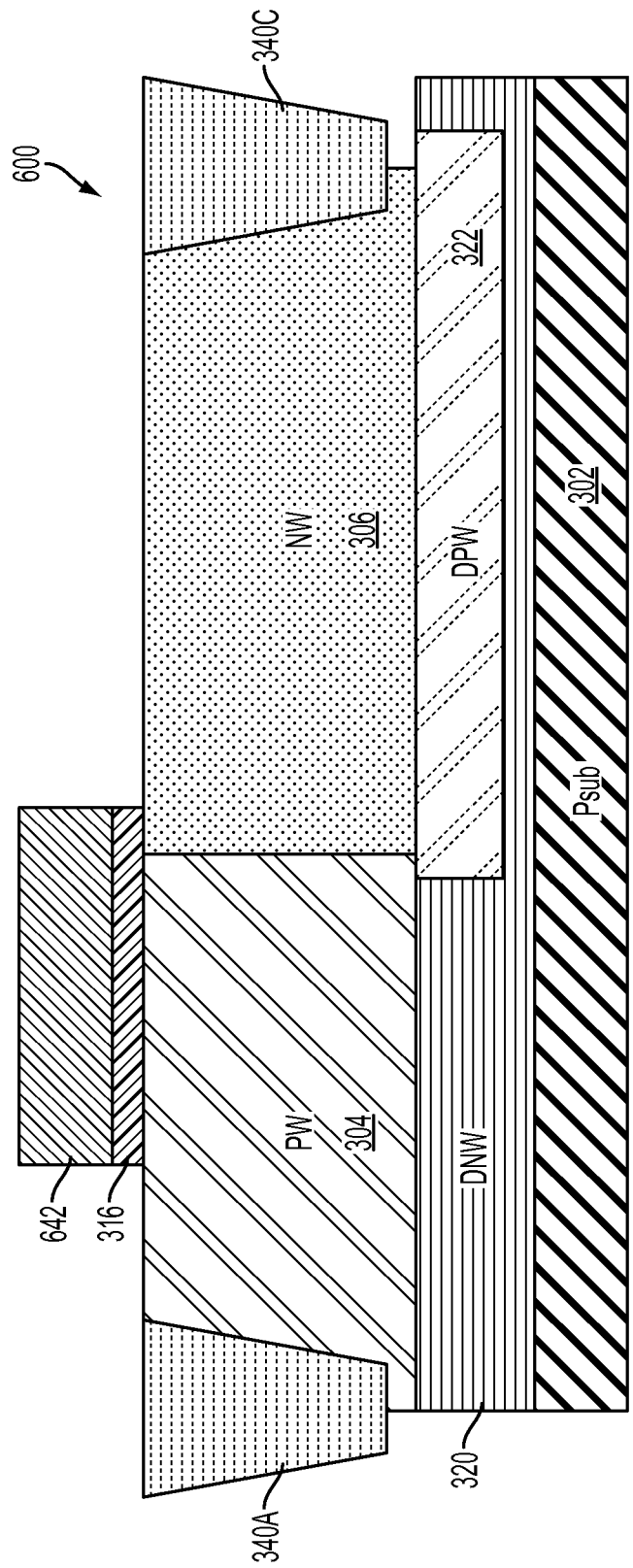

FIG. 4 is a cross-sectional side view 600 during a process to form an isolation structure for the MOSFET 300, in accordance with some embodiments. Following a CMOS process and building on the structure shown in FIG. 2, gate oxide 316 is deposited over the PW 304 and NW 306. In some embodiments, other dielectric materials are used in place of silicon dioxide for the gate oxide 316. A conductive layer 642, is deposited over the gate oxide 316. In some embodiments, the conductive layer 642 is polysilicon.

Figure 5:
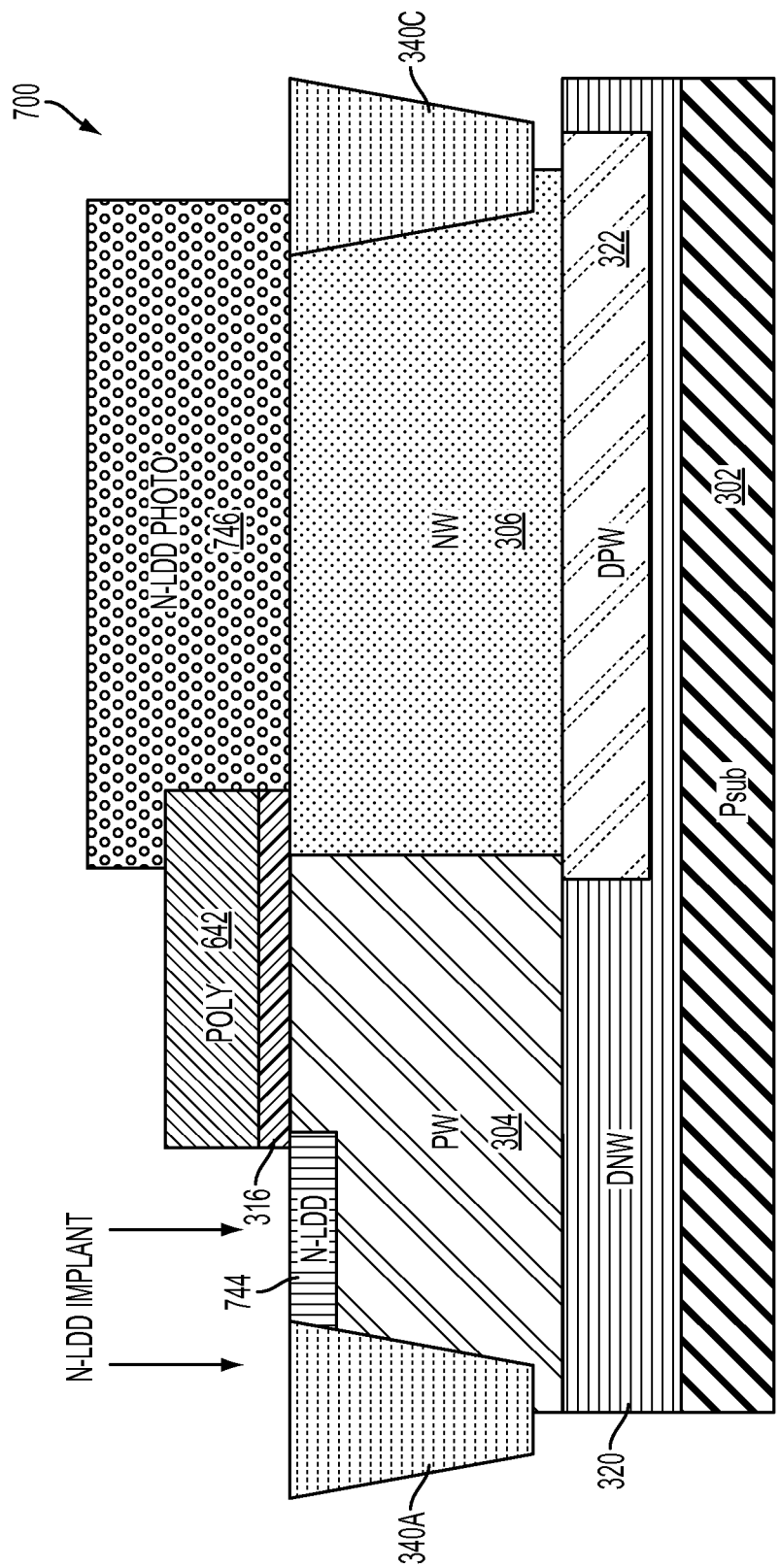

FIG. 5 is a cross-sectional side view 700 during a process to form an isolation structure for the MOSFET 300, in accordance with some embodiments. An n-type lightly doped drain/source (NLDD) region implant is used to form an N-LDD portion 744 of PW 304. N-LDD photoresist 746 is formed over the NW 306, the conductive layer 642, and the STI 340C to block the MOSFET drain.

Figure 6:
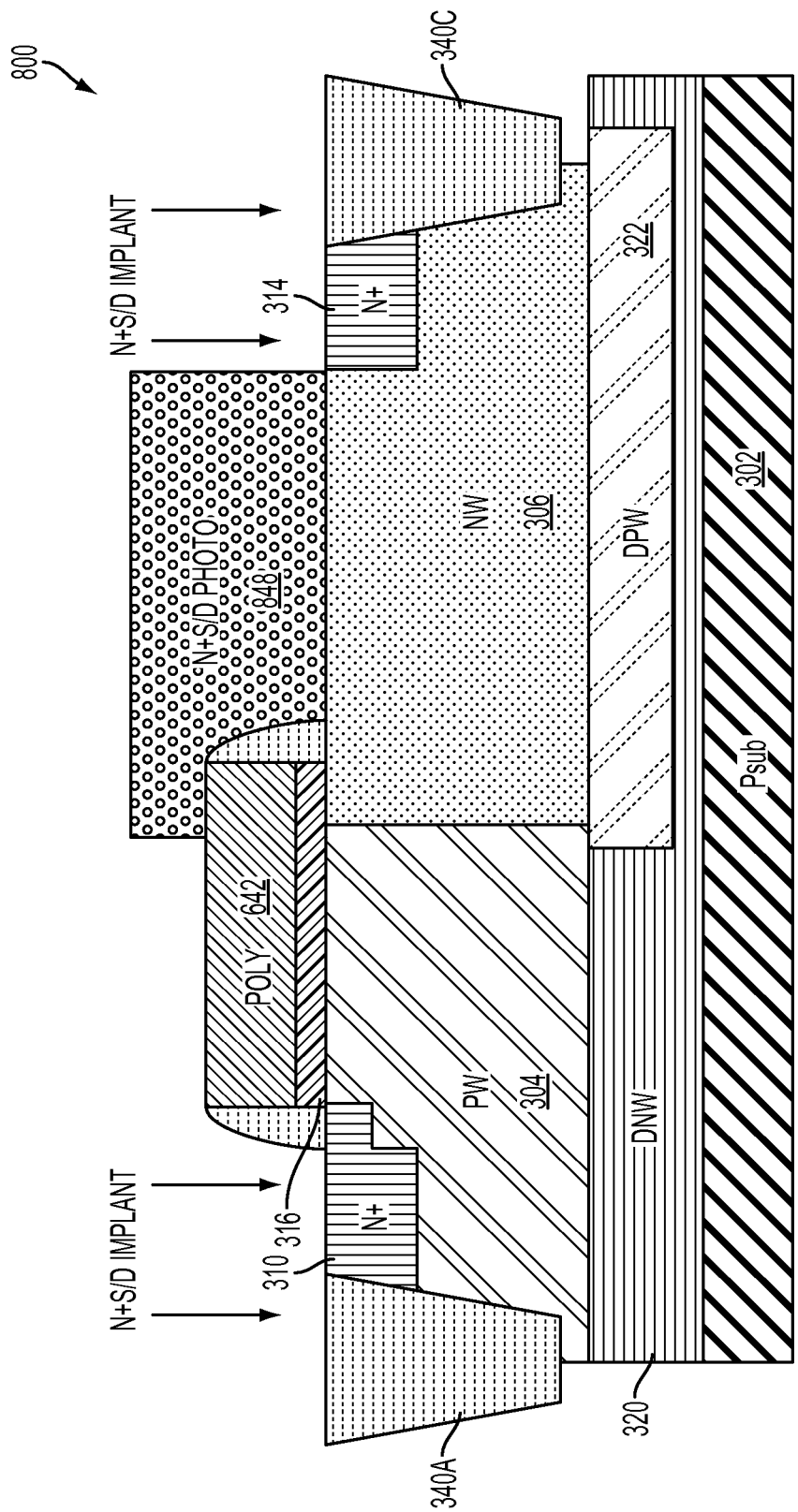

FIG. 6 is a cross-sectional side view 800 during a process to form an isolation structure for the MOSFET 300, in accordance with some embodiments. An n-type ion implant of the source region 310 and the drain region 314 is performed. In some embodiments, the n-type ion implant is n+ type, as illustrated by "n+S/D implant" in FIG. 6. A photoresist 848 is formed over the NW 306 and the conductive layer 642 to block the MOSFET drain.

Figure 7:
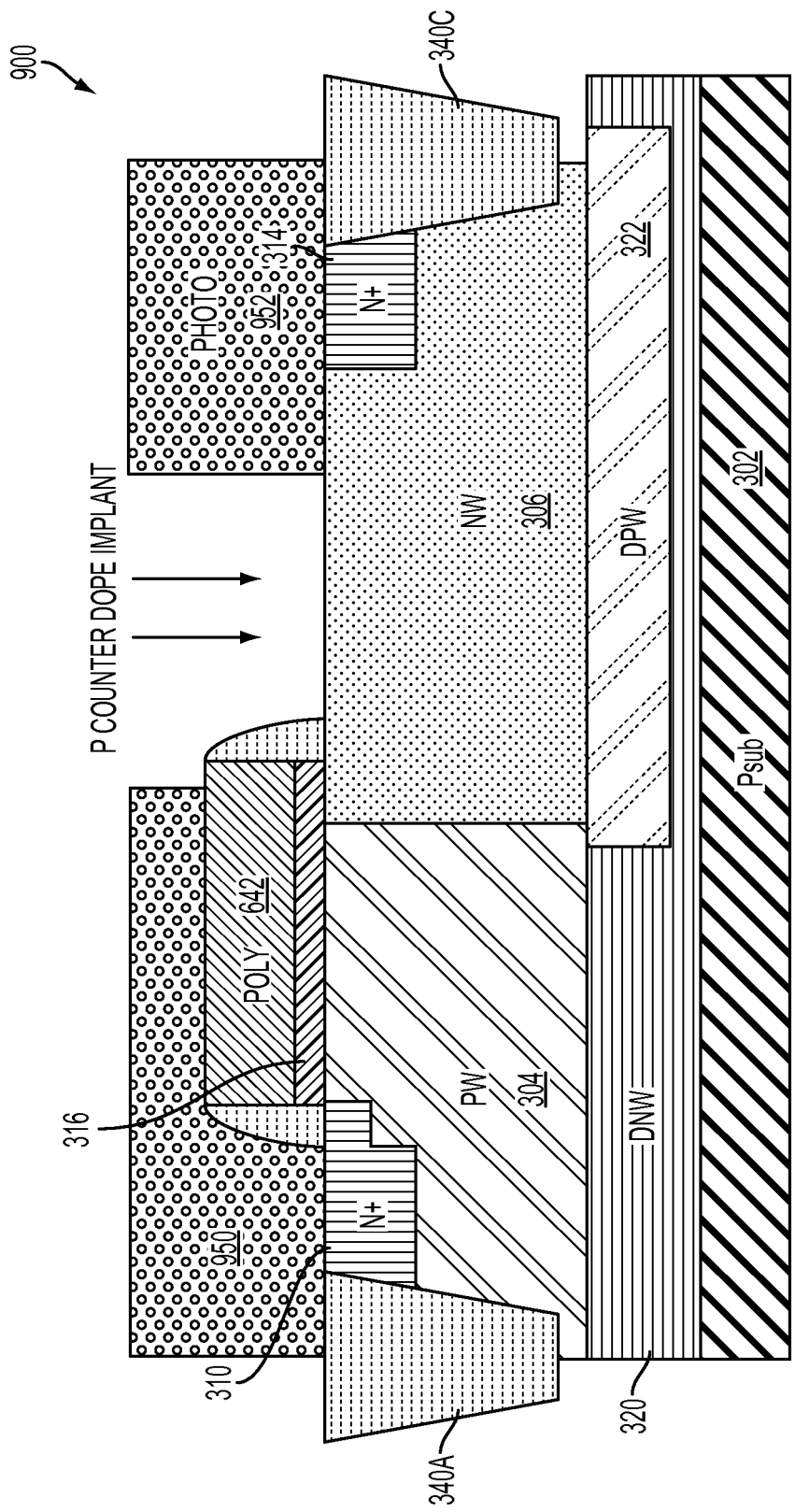

FIG. 7 is a cross-sectional side view 900 during a process to form an isolation structure for the MOSFET 300, in accordance with some embodiments. In some embodiments, a p-type counter dopant implant is introduced to a gap between photoresist 950 and photoresist 952 over a drain area of the NW 306, to form a p+ or P-LDD region 1054, as shown in FIG. 8.

Figure 8:
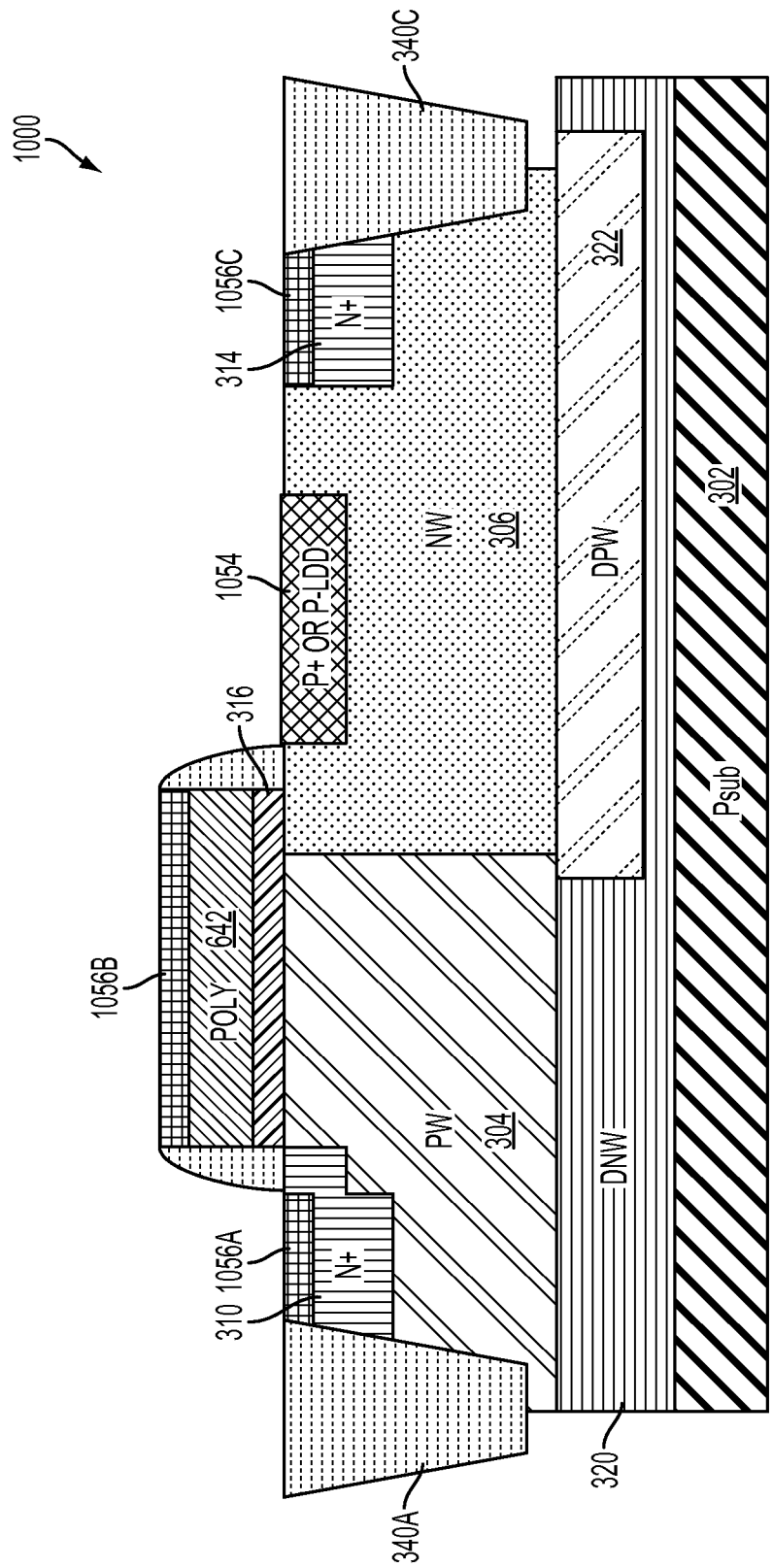

FIG. 8 is a cross-sectional side view 1000 during a process to form an isolation structure for the MOSFET 300, in accordance with some embodiments. In some embodiments, silicide area 1056A is formed in source area 310, silicide area 1056B is formed in polysilicon 642, and silicide area 1056C is formed in drain area 314.

Figure 9:
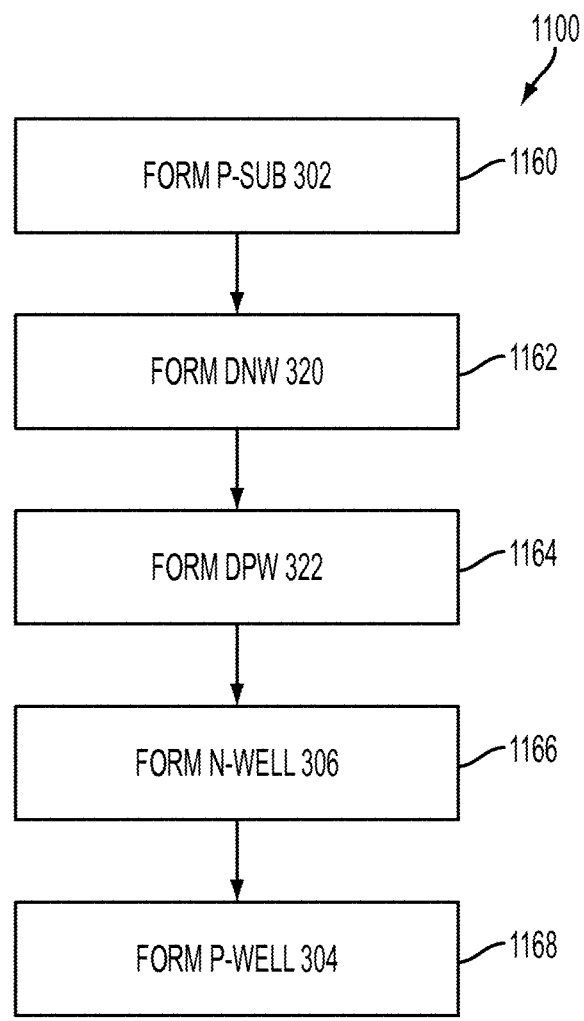
FIG. 9 is a flowchart for a process for forming the isolation structure for the MOSFET in FIG. 1, in accordance with some embodiments.

FIG. 9 is a flowchart 1100 for a process for forming an isolation structure for a MOSFET, such as MOSFET 300, in accordance with some embodiments. A p-type dopant is added to a semiconductor substrate in step 1160 to form Psub 302. A deep n-type well 320 is formed adjacent to the Psub 302 in step 1162. A deep p-type well 322 is formed in the deep n-type well 320 in step 1164. The deep p-type well 322 is separated from the Psub 302 by the deep n-type well 320. An n-type well 306 is formed over the deep p-type well 322 in step 1166. The drain terminal is later formed over the n-type well 306. A p-type well 304 is formed over the deep n-type well 320 in step 1168. The source terminal is later formed over the p-type well 304. The p-type well 304 is formed adjacent to the n-type well 306.

In some embodiments, a structure comprises a p-type substrate, a deep n-type well and a deep p-type well. The deep n-type well is adjacent to the p-type substrate and has a first conductive path to a first terminal. The deep p-type well is in the deep n-type well, is separated from the p-type substrate by the deep n-type well, and has a second conductive path to a second terminal. A first n-type well is over the deep p-type well. A first p-type well is over the deep p-type well.

In some embodiments, a structure comprises a p-type substrate, a deep n-well, a deep p-well, a first n-type well, and a first p-type well. The deep n-well is over the p-type substrate. The deep p-well is in the deep n-well. The first n-type well is over the deep p-well. The first p-type well is over the deep p-well. A second n-type well is over the deep n-well.

In a method of some embodiments, a deep n-type well is formed adjacent a p-type substrate. A deep p-type well is in the deep n-type well, is separated from the p-type substrate by the deep n-type well. A first n-type well is formed over the deep p-type well. A first p-type well is formed over the deep p-type well. The first p-type well serves as a conductive path from the deep p-type well to a terminal. A portion of the deep p-type well in electrical connection with the first p-type well is determined based on conducitve connection between the deep p-type well and the first p-type well.

One of ordinary skill in the art will recognize the operations of method 1100 are merely examples and additional operations are includable, describe operations are removable and an order of operations are adjustable without deviating from the scope of method 1100.

It will be readily seen by one of ordinary skill in the art that the disclosed embodiments fulfill one or more of the advantages set forth above. After reading the foregoing specification, one of ordinary skill in the pertinent art will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A structure comprising:
a p-type substrate;
a deep n-type well adjacent to the p-type substrate and having a first conductive path to a first terminal;
a deep p-type well
in the deep n-type well,
the deep p-type well is separated from the p-type substrate by the deep n-type well, and
the deep p-type well has a second conductive path to a second terminal, the second terminal being configured to bias the deep p-type well;
a first n-type well over the deep p-type well;
a first p-type well over the deep p-type well, wherein the deep p-type well has a third conductive path through the first p-type well to a third terminal;
a gate structure of a transistor over and partially overlapping the first n-type well and the first p-type well;
a first n+ type doped region in the first n-type well;
a drain terminal of the transistor over and in contact with the first n+ type doped region;
a source terminal of the transistor over the first p-type well,
wherein the deep n-type well comprises a thickness thicker than a thickness of the deep p-type well,
the thickness of the deep p-type well is selected based on a voltage applied to the deep p-type well from the third terminal through the third conductive path,
a ratio of the thickness of the deep p-type well to the thickness of the deep n-type well is 2:3, and
the thickness of the deep n-type well is selected based on a voltage punch-through.

2. The structure of claim 1, wherein
a portion of the deep p-type well is not adjacent to the first n-type well.

3. The structure of claim 1, wherein
the first conductive path includes
a second n-type well;
a second n+ type doped region in the second n-type well; and
the first terminal over and in contact with the second n+ type doped region; and
the first terminal is configured to bias the deep n-type well.

4. A structure comprises:
a p-type substrate;
a deep n-well over the p-type substrate;
a deep p-well separated from the p-type substrate by the deep n type n well;
a first n-type well over and in contact with the deep p-well;
a first p-type well over and in contact with the deep p-well;
a second p-type well over and in contact with the deep p-well and the deep n-well;
a second n-type well over and in contact with the deep n-well;
a gate structure of a transistor over and partially overlapping the first n-type well and the first p-type well;
a first n+ type doped region in the first n-type well;
a first terminal configured to bias the deep p-type well through the second p-type well;
a second terminal configured to bias the deep p-type well through the first p-type well;
a drain terminal of the transistor over and in contact with the first n+ type doped region; and
a source terminal of the transistor over the first p-type well,
wherein a ratio of a thickness of the deep p-well to a thickness of the deep n-well is 2:3, and
the thickness of the deep p-well and the thickness of the deep n-well are selected based on a voltage punch-through.

5. The structure of claim 4, further comprising:
a conductive path through the second n-type well to the deep n-well.

6. The structure of claim 4, further comprising:
a second n+ type doped region in the second n-type well; and
a third terminal over and in contact with the second n+ type doped region,
wherein
the second n+ type doped region and the third terminal are electrically connected with the second n-type well and with the deep n-well.

7. The structure of claim 4, wherein
the first p-type well is over and in contact with the deep n-well.

8. The structure of claim 4, wherein
a portion of the deep p-well is under the first p-type well, and is determined based on conductive connection between the deep p-well and the first p-type well.

9. A method comprising:
forming a deep n-type well adjacent to a p-type substrate;
forming a deep p-type well in the deep n-type well, the deep p-type well separated from the p-type substrate by the deep n-type well;
forming a first n-type well over the deep p-type well;
forming a first p-type well over the deep p-type well, wherein the first p-type well serves as a first conductive path from the deep p-type well to a first terminal, the first terminal being configured to bias the deep p-type well, and a portion of the deep p-type well in electrical connection with the first p-type well is determined based on conductive connection between the deep p-type well and the first p-type well;

forming a gate structure of a transistor over and partially overlapping the first n-type well and the first p-type well;
forming a first n+ type doped region in the first n-type well;
forming a p+ type doped region or a p-type lightly doped drain (LDD) region in the first n-type well;
forming a drain terminal of the transistor over and in contact with the first n+ type doped region;
forming a source terminal of the transistor over the first p-type well;
forming a second conductive path configured to bias the deep p-type well;
wherein a thickness of the deep n-type well is different than a thickness of the deep p-type well,
the thickness of the deep p-type well is selected based on a voltage applied to the deep p-type well from the first terminal through the first conductive path,
the thickness of the deep p-type well and the thickness of the deep n-type well are selected based on a voltage punch-through, and
a ratio of the thickness of the deep p-type well to the thickness of the deep n-type well is 2:3.

10. The method of claim 9, wherein
the deep p-type well is formed by ion implantation of boron or of boron diflouride.

11. The method of claim 9, wherein
the deep p-type well is formed by ion implantation of boron or of boron diflouride with a voltage in the kiloelectron volts.

12. The method of claim 9, wherein
the thickness of the deep n-type well is greater than the thickness of the deep p-type well.

13. The structure of claim 1, further comprising a second n+ type doped region in the first p-type well, the source terminal of the transistor being over and in contact with the second n+ type doped region.

14. The structure of claim 4, further comprising a second n+ type doped region in the first p-type well, the source terminal of the transistor being over and in contact with the second n+ type doped region.

15. The structure of claim 1, wherein
the deep n-type well is in contact with a second n-type well and a second p-type well.

16. The structure of claim 1, wherein
the second conductive path includes
a second p-type well;
a p-type doped region in the second p-type well; and
the second terminal.

17. The structure of claim 4, comprising
a p-type region,
wherein
the p-type region and the first terminal are electrically connected with the second p-type well and with the deep p-well.

18. The method of claim 9, further comprising:
forming a second p-type well over the deep p-well; and
forming a second terminal over the second p-type well, wherein the second p-type well serves as the second conductive path from the deep p-type well to the second terminal.

19. The structure of claim 1, wherein
a combined thickness of the thickness of the deep n-type well and the thickness of the deep p-type well is between 200 nm and 1,500 nm.

20. The structure of claim 4, wherein
a combined thickness of the thickness of the deep n-well and the thickness of the deep p-well is between 200 nm and 1,500 nm.

21. The structure of claim 9, wherein
a combined thickness of the thickness of the deep n-type well and the thickness of the deep p-type well is between 200 nm and 1,500 nm.

* * * * *